United States Patent
Han et al.

(10) Patent No.: US 9,493,588 B2
(45) Date of Patent: Nov. 15, 2016

(54) DIBLOCK COPOLYMER, PREPARATION METHOD THEREOF, AND METHOD OF FORMING NANO PATTERN USING THE SAME

(75) Inventors: Yang-Kyoo Han, Seoul (KR); Je-Gwon Lee, Seoul (KR); Su-Hwa Kim, Seongnam-si (KR)

(73) Assignee: LG CHEM, LTD., Seoul (KR)

(*) Notice: Subject to any disclaimer, the term of this patent is extended or adjusted under 35 U.S.C. 154(b) by 217 days.

(21) Appl. No.: 13/992,604

(22) PCT Filed: Mar. 16, 2012

(86) PCT No.: PCT/KR2012/001927
§ 371 (c)(1),
(2), (4) Date: Jun. 7, 2013

(87) PCT Pub. No.: WO2012/144735
PCT Pub. Date: Oct. 26, 2012

(65) Prior Publication Data
US 2013/0248488 A1    Sep. 26, 2013

(30) Foreign Application Priority Data

Apr. 22, 2011  (KR) .................. 10-2011-0038029

(51) Int. Cl.
*C08F 22/38*  (2006.01)
*H01L 21/3065*  (2006.01)
(Continued)

(52) U.S. Cl.
CPC ............ *C08F 22/38* (2013.01); *B82Y 10/00* (2013.01); *B82Y 40/00* (2013.01); *C08F 293/005* (2013.01); *G03F 7/0002* (2013.01);
(Continued)

(58) Field of Classification Search
CPC .. C08F 22/38; C08F 293/005; C08F 220/18; C08F 220/56; C08F 2438/03; H01L 21/3065; B82Y 40/00; B82Y 10/00; G03F 7/0002; B81C 2201/0198; B81C 2201/0149; B81C 1/00396
See application file for complete search history.

(56) References Cited

U.S. PATENT DOCUMENTS 8,518,837 B2 * 8/2013 Russell .............. B81C 1/00031
                                                      438/486
2006/0249784 A1 * 11/2006 Black et al. ............... 257/327

(Continued)

FOREIGN PATENT DOCUMENTS

JP   2007-125699 A    5/2007
KR   10-2005-0056288 A    6/2005

OTHER PUBLICATIONS

Graduate School of Hanyang University, Chemistry Department, Thesis: "Synthesis of New Block Copolymers from n-Butyl Acrylate and DPAA by RAFT Polymerization and Their Properties", Feb. 2008.

(Continued)

*Primary Examiner* — Anita Alanko
(74) *Attorney, Agent, or Firm* — Dentons US LLP

(57) ABSTRACT

The present invention relates to a diblock copolymer that may facilitate formation of a finer nano pattern, and be used for manufacture of an electronic device including a nano pattern or a bio sensor, and the like, a method for preparing the same, and a method for forming a nano pattern using the same,
The diblock copolymer comprises a hard segment including at least one specific acrylamide-based repeat unit, and a soft segment including at least one (meth)acrylate-based repeat unit.

3 Claims, 8 Drawing Sheets

(51) Int. Cl.
*B82Y 10/00* (2011.01)
*B82Y 40/00* (2011.01)
*C08F 293/00* (2006.01)
*G03F 7/00* (2006.01)
*C08F 220/18* (2006.01)
*C08F 220/56* (2006.01)
*B81C 1/00* (2006.01)

(52) U.S. Cl.
CPC ...... *H01L 21/3065* (2013.01); *B81C 1/00396* (2013.01); *B81C 2201/0149* (2013.01); *B81C 2201/0198* (2013.01); *C08F 220/18* (2013.01); *C08F 220/56* (2013.01); *C08F 2438/03* (2013.01)

(56) References Cited

U.S. PATENT DOCUMENTS

| | | | | |
|---|---|---|---|---|
| 2008/0038467 | A1* | 2/2008 | Jagannathan | B82Y 20/00 427/256 |
| 2008/0176767 | A1* | 7/2008 | Millward | B81C 1/00031 506/20 |
| 2011/0097559 | A1* | 4/2011 | Hawker et al. | 428/195.1 |
| 2012/0009390 | A1* | 1/2012 | Yang | B81C 1/00031 428/179 |
| 2012/0028476 | A1* | 2/2012 | Li | H01L 21/0338 438/780 |
| 2012/0164392 | A1* | 6/2012 | Stoykovich | B81C 1/00031 428/172 |
| 2015/0228298 | A1* | 8/2015 | Han | G11B 5/8404 428/836.1 |
| 2015/0232628 | A1* | 8/2015 | Han | C08J 7/12 427/539 |

OTHER PUBLICATIONS

"Synthesis of Novel DPAA Based Block Copolymers by Raft Polymerizations and Their Morphology Control" ; Lee, et al.; In Abstract for Annual Meeting of the Polymer Society of Korea; 2006.

"Preparation of Novel n-BA/DPAA Block Copolymer by Raft Polymerization and Their Morphological Properties"; Lee, et al. In Abstract for Annual Meeting of the Polymer Society of Korea; 2008.

"Synthesis Characterization of New Block Copolymers with PDPAA Hard Block and Poly (n-butyl acrylate) Soft Block Using RAFT Polymerization" Lee, et al. In Abstract for Annual Meeting of the Polymer Society of Korea; 2008.

"Synthesis and Characterization of New Diblock Copolymers from n-Butyl Acrylate and DPAA by RAFT Polymerization" ; Lee, et al; In Abstract for Annual Meeting of the Polymer Society of Korea; 2007.

* cited by examiner

DIBLOCK COPOLYMER, PREPARATION METHOD THEREOF, AND METHOD OF FORMING NANO PATTERN USING THE SAME

This application is a National Stage Entry of International Application No. PCT/KR2012/001927 filed Mar. 16, 2012, and claims the benefit of Korean Application No. 10-2011-0038029 filed on Apr. 22, 2011 all of which are hereby incorporated by reference in their entirety for all purposes as if fully set forth herein.

TECHNICAL FIELD

The present invention relates to a novel diblock copolymer, a method of preparing the same, and a method of forming a nano pattern using the same. More particularly, the present invention relates to a diblock copolymer that may facilitate formation of a finer nano pattern, and be used for manufacture of an electronic device including a nano pattern or a bio sensor, and the like, a method of preparing the same, and a method of forming a nano pattern using the same,

BACKGROUND OF THE ART

With the rapid progress of nano scientific technology, demands on nano-scaled material are increasing and the size of an electronic device is more and more decreasing. Thus, photolithography, which is the existing top-down approach used to manufacture a silicon device, is reaching the limit. Namely, although currently used photolithography technology for manufacturing a silicon semiconductor has many advantages in terms of process optimization and applications, it is difficult to fabricate a printed circuit of 30 nm or less due to technical limitations of dispersion of light and wavelength of the light source. In addition, studies on electron beam lithography or EUV (extreme ultraviolet) lithography are under progress. However, the former is difficult to simultaneously form two-dimensional patterns, and the latter has difficulty in controlling light absorbed in photoresist or lifespan of an optical instrument because significantly high optical energy should be used.

Therefore, to develop next generation semiconductor, problems of the existing photolithography technology should be overcome, and it is also required to reduce manufacture cost and simplify the process. Recently, as a method satisfying these requirements, self-assembly method of a block copolymer is being studied. A method of forming patterns using a nano structure of a block copolymer, unlike the existing methods, has advantages of simultaneously forming two-dimensional patterns. Particularly, a nanostructure is simply formed by microphase separation between the chains of a block copolymer, and thus, a process cost may be reduced.

A block copolymer includes polymer blocks having different chemical structures, connected through a covalent bond, and according to the compositions of blocks constituting the block copolymer, the length of the chain, and Flory-Huggins parameter, it may form various nano structures including a complicated three-dimensional structure such as a gyroid, or a HPL (hexagonal perforated lamellae) structure, as well as a basic structure such as a sphere, a cylinder, or a lamellae. And, the size of the nanostructure may be controlled from 5 to 50 nm, according to chemical structure of a block copolymer, compositional ratio of blocks, or molecular weight, and the like. Lithography using a block copolymer (pattern forming method) refers to transcribing a nano structure of the thin film of a block copolymer onto a substrate to form nano patterns. The cost is significantly low, and the manufacturing process may be very simple, compared to photolithography currently used in a semiconductor manufacturing process.

Meanwhile, with the progress of polymer synthesis technology, studies on chemical physical factors influencing on the synthesis and nano structures of various block copolymers have been widely progressed. Particularly, studies on the control of a nanostrucrue using a PS-PMMA (polystyrene-polymethacrylate)-based amorphous block copolymer have been intensively progressed. Namely, if morphology of a PS-PMMA block copolymer is controlled by microphase separation, a cylindrical nanostructure arranged in a hexagonal shape may be easily formed. However, since the cylindrical nanostructure arranged in a hexagonal shape is inappropriate for use in a microcircuit printing process in the semiconductor industry, it takes more time to manufacture related electronic devices and energy consumption is high.

Accordingly, from an economical point of view, and considering semiconductor circuit design and software, a cylindrical nanostructure arranged in a square (or rectangular) shape is much more favorable than a cylindrical nanostructure arranged in a hexagonal shape for manufacturing an electronic device. On this account, recently, studies on formation of a cylindrical nanostructure arranged in a square (or rectangular) shape by self-assembly or microphase separation of a block copolymer are actively progressed. For example, it was reported that a PS-PMMA diblock copolymer is coated on a substrate having chemical patterns of a square (or rectangular) arrangement, and then, formation of a nanostructure with a square (or rectangular) arrangement is forcibly induced. However, there is a problem that a nanostructure arranged in a square shape may not be formed unless the cycle of the chemical patterns and the cycle of the nanostructure of the block copolymer coincide with each other.

Meanwhile, it was reported that if an A-B-C type triblock copolymer having three blocks is used instead of the above explained diblock copolymer, a nanostructure arranged in a square shape may be formed in a narrow area. And, it was also reported that using a triblock copolymer having a core-shell spherical nanostructure, a nanostructure of a square arrangement is formed only on the uppermost layer according to the thickness of the film. And, an inorganic block with high etching resistance was introduced in a triblock copolymer to embody a cylindrical nanostructure of a square arrangement, which could not be obtained with a diblock copolymer, thus suggesting applicability as a next generation nano patterning technology.

However, examining the above explained study results, to form a cylindrical nanostructure arranged in a square (or rectangular) shape, which is suitable for a semiconductor circuit design, it is required to separately use a photomask having micrometer-scaled topological or chemical patterns together with a diblock copolymer, which is a substrate for forming a nanostructure, or to prepare and use an A-B-C type triblock copolymer that is difficult to synthesize due to its complicated molecular structure, or to additionally use an additive inducing a nanostructure or a mixture causing a hydrogen bond between molecules. On this account, these are too complicated to apply as a next generation nano patterning technology or economically infeasible. Furthermore, the existing PS-PMMA diblock copolymer that has been intensively studied so far as well as any kinds of diblock copolymers could not directly form a cylindrical nano structure arranged in a square (or rectangular) shape without an auxiliary material or additive having a nanostructure transcribed thereto.

Namely, according to the prior art, a cylindrical nano structure arranged in a square (or rectangular) shape could not be formed, or separate use of a phosomask was required or synthesis of the block copolymer itself was complicated. On this account, any pattern forming method using previously known block copolymers may not easily form a nano structure arranged in a square (or rectangular) shape, and thus may not be suitably applied for design and mass production of semiconductor circuit.

DETAILED DESCRIPTION OF THE INVENTION

Technical Objectives

The present invention relates to a diblock copolymer that may facilitate formation of, for example, a cylindrical nano-structure arranged in a square (or rectangular) shape, and a method for preparing the same.

The present invention also relates to a polymer thin film that comprises the diblock copolymer and may be appropriately used in the manufacture of an electronic device including a finer nano pattern or a nano bio sensor, and the like, and a method for manufacturing the same.

The present invention also relates to a method for forming a nano pattern using the polymer thin film.

Technical Solutions

The present invention provides a diblock copolymer comprising a hard segment comprising at least one repeat unit of the following Chemical Formula 1, and a soft segment comprising at least one (meth)acrylate-based repeat unit of the following Chemical Formula 2:

[Chemical Formula 1]

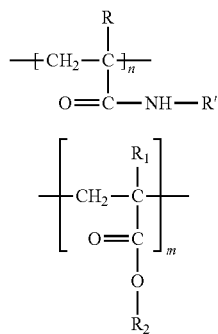

[Chemical Formula 2]

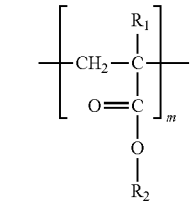

in the above Chemical Formula 1, n is an integer of from 5 to 600, R is hydrogen or a methyl group, R' is X,

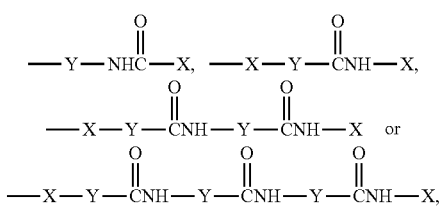

X is —Z—R", Y is a C1-10 alkylene group, Z is a C6-20 arylene group, R" is a C10-20 linear or branched hydrocarbon or a C10-20 linear or branched perfluorohydrocarbon, and in the above Chemical Formula 2, m is an integer of from 30 to 1000, $R_1$ is hydrogen or a methyl group, and $R_2$ is a C1-20 alkyl group.

The present invention also provides a method for preparing a diblock copolymer comprising conducting RAFT (reversible addition fragmentation chain transfer) polymerization of a reactant comprising at least one kind of (meth)acrylate-based monomers of the following Chemical Formula 3, in the presence of a radical initiator and a RAFT reagent; and conducting RAFT polymerization of a reactant comprising at least one kind of monomers of the following Chemical Formula 4, in the presence of the above polymerization product and a radical initiator:

[Chemical Formula 3]

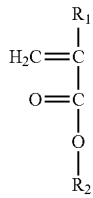

[Chemical Formula 4]

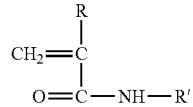

In the Chemical Formulae 3 and 4, $R_1$, $R_2$, R and R' are as defined in the Chemical Formulae 1 and 2.

The present invention also provides a polymer thin film comprising the diblock copolymer, wherein on one of the hard segments or soft segments, the other segments are regularly arranged in cylindrical forms or in spherical forms. The cylindrical forms may be regularly arranged in a lamellar shape, a square (or rectangular) shape, or a hexagonal shape, as seen from one plane of the thin film.

The present invention also provides a method for manufacturing a polymer thin film comprising coating a solution of the diblock copolymer on a substrate to form a thin film; and solvent-annealing the coated thin film, or heat treating it respectively at a melting point of the hard segment and a glass transition temperature of the soft segment.

The present invention also provides a method for forming a nano pattern comprising forming a polymer thin film on a substrate on which a film to be patterned is formed, by the above method; irradiating UV to the polymer thin film to remove the soft segments; and conducting reactive ion etching (RIE) of a film to be patterned using the polymer thin film from which the soft segments are removed as a mask.

Hereinafter, a diblock copolymer and a preparation method thereof, a polymer thin film comprising the same and a manufacturing method thereof, and a method of forming a nanopattern applying the polymer thin film according to embodiments of the invention will be explained in detail.

According to one embodiment of the invention, there is provided a diblock copolymer comprising a hard segment comprising at least one repeat unit of the following Chemical Formula 1, and a soft segment comprising at least one (meth)acrylate-based repeat unit of the following Chemical Formula 2:

[Chemical Formula 1]

[Chemical Formula 2]

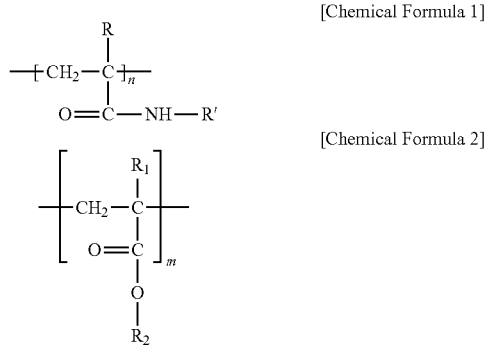

in the above Chemical Formula 1, n is an integer of from 5 to 600, R is hydrogen or a methyl group, R' is X,

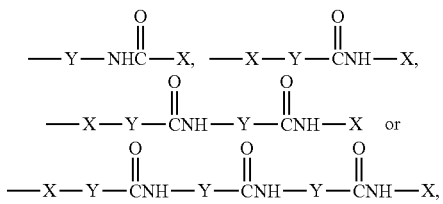

X is —Z—R″, Y is a C1-10 alkylene group, Z is a C6-20 arylene group, R″ is a C10-20 linear or branched hydrocarbon or a C10-20 linear or branched perfluorohydrocarbon, and in the above Chemical Formula 2, m is an integer of from 30 to 1000, $R_1$ is hydrogen or methyl, and $R_2$ is a C1-20 alkyl group.

The inventors synthesized a novel diblock copolymer by sequential polymerization of specific (meth)acrylate-based monomers and acrylamide-based monomers (monomers of the following Chemical Formulae 3 and 4) through RAFT polymerization known as living radical polymerization, and found out the characteristics. Specifically, it was confirmed that if the diblock copolymer is treated by solvent annealing or heat treatment, and the like, a polymer thin film with a nanostructure (nanopattern) may be manufactured wherein on the hard segments including the acrylamide-based repeat unit of the Chemical Formula 1 or the soft segments including the (meth)acrylate-based repeat unit of the Chemical Formula 2, the other segments are regularly arranged in cylindrical forms, and the like. Furthermore, by controlling the conditions of the solvent annealing or heat treatment, the diblock copolymer and the polymer thin film may have a nano structure wherein the cylindrical forms are regularly arranged in a square (or rectangular) shape, and the like.

Therefore, using the above diblock copolymer, finer nano patterns may be formed, compared to photolithograph applied until now, and the nano patterns may include cylindrical patterns that are regularly arranged in a square (or rectangular) shape, and the like, and thus, it may be appropriate for circuit design of a semiconductor device and it may be appropriately applied for formation of micropatterns of a device, and the like. And, since it may form the above explained nano patterns simply by controlling the morphology of the diblock copolymer itself without applying a triblock copolymer of which synthesis is complicated or applying an auxiliary metallic mold such as a separate photomask of which nano structure is processed beforehand, the diblock copolymer may be applied for a micropattern formation process of an electronic device including a next generation semiconductor device, or manufacture of a nano bio sensor, and the like.

It is considered that the formation of the above explained regular nanostructure or nanopatterns using the diblock copolymer arises from self-assembling behavior of the acrylamide-based polymer block of the Chemical Formula 1 making up the hard segment, and micro-phase separation from the soft segment. Hereinafter, the technical cause will be explained in more detail.

A polymer block making up the hard segment (i.e., repeat unit of the Chemical Formula 1) may be obtained by RAFT polymerization of specific acrylamide-based monomers, to be explained later. The acrylamide-based monomer has a chemical structure that contains a self-assembling non-polar aliphatic hydrocarbon (having more than 10 carbon atoms), an arylene group causing π-π orbital interactions and an amide group causing intermolecular or intramolecular hydrogen bonding. Through the self-assembling behavior of the long-chain aliphatic hydrocarbon, π-π orbital interactions of the arylene groups and intramolecular hydrogen bonding of the amide groups, the monomer may form a regular monoclinic crystal structure, preferably monoclinic single crystals in the solid state.

Thus, if a RAFT polymerization of the monomers is progressed, living radical polymerization occurs while the monomer molecules are well-oriented, and thereby the individual monomer molecules are regularly arranged in the polymer chain. More specifically, the monomer molecules well-oriented through the polymerization combine together to form a polymer chain (i.e., one polymer building block), and these polymer building blocks aggregate to form a regularly arranged polymer. Due to the regular arrangement of the polymer building blocks in the polymer, the polymer block of the hard segment (i.e., repeat unit of the Chemical Formula 1) may manifest self-assembling property and crystallinity, which define a plurality of spaces having uniform size, after polymerization.

Meanwhile, the diblock copolymer is prepared by RAFT polymerization of the acrylamide-based monomers after polymer blocks making up the soft segments are formed by RAFT polymerization of the (meth)acrylate-based monomers. Thus, if RAFT polymerization of the acrylamide-based monomers is progressed, the polymer blocks of the soft segments are regularly spontaneously arranged in the plurality of spaces defined by the hard segments and self-assembling property of the monomer making up the hard segment, thereby forming the above explained diblock copolymer. It is considered that the regular arrangement of the soft segment polymer blocks arises from micro-phase separation between the crystalline hard segment and the amorphous soft segment.

As the result, in the diblock copolymer and a polymer thin film that is treated by solvent annealing or heat treatment, a nano structure (nano pattern) may be formed wherein on the hard segments including the repeat unit of the Chemical Formula 1 or the soft segments including the repeat unit of the Chemical Formula 2, the other segments are regularly arranged in cylindrical forms or in spherical forms. And, by controlling the conditions of the solvent annealing or heat treatment, the diblock copolymer and the polymer thin film may have a nano structure wherein the cylindrical forms are regularly arranged in a square (or rectangular) shape, and the like. The regular nanostructure or nanopatterns may be identified through SEM photograph of the polymer thin film, and the like.

Hereinafter, a diblock copolymer according to one embodiment, a preparation method thereof, and each segment thereof will be explained in more detail.

The diblock copolymer according to one embodiment of the invention includes a hard segment including a repeat unit of the Chemical Formula 1. In the repeat unit of the Chemical Formula 1, Z may be a C6-20 arylene group, and specific examples thereof may include:

ortho-phenylene

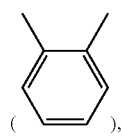

meta-phenylene

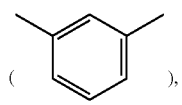

para-phenylene

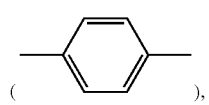

naphthalene

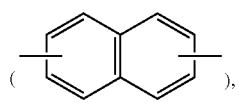

azobenzene

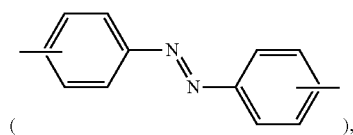

anthracene

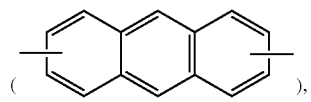

phenanthrene

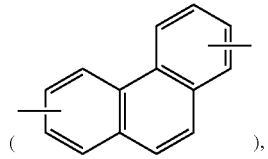

tetracene

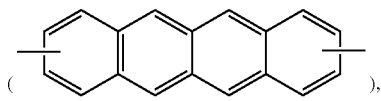

pyrene

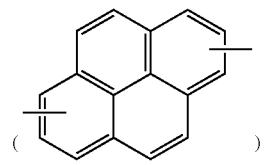

or benzopyrene

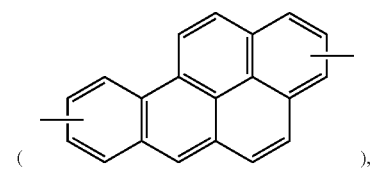

and the like.

R" is a linear or branched hydrocarbon substituted at the ortho-, meta- or para-position of the aromatic ring in Z, and the hydrocarbon has a long chain containing at least 10 carbon atoms, more specifically, 10 to 20 carbon atoms. Also, the hydrocarbon of R" may be substituted with fluorine and it may be a linear or branched perfluorohydrocarbon having 10 to 20 carbon atoms.

As the repeat unit of the Chemical Formula 1 and the monomer of the following Chemical Formula 4 have a long chain hydrocarbon and an arylene group, crystallinity and self-assembling property of the hard segment and the monomers may be remarkably manifested, and thus, a nanostructure or nanopatterns may be formed wherein on one of the crystalline hard segments or the amorphous soft segments, the other segments are regularly arranged in a square (or rectangular) shape, and the like, by micro-phase separation.

The hard segment may include one kind of a repeat unit of the Chemical Formula 1, or it may include two or more kinds of a repeat unit of the Chemical Formula 1 to include a copolymer repeat unit.

And, the diblock copolymer according to one embodiment includes an amorphous soft segment together with the above explained hard segment, and the soft segment includes a (meth)acrylate-based repeat unit of the Chemical Formula 2. The (meth)acrylate-based repeat unit may be derived from a common acrylate-based or methacrylate-based monomers, for example, methyl acrylate (MA), methyl methacrylate (MMA), ethyl acrylate (EA), ethyl methacrylate (EMA), n-butyl acrylate (BA) or n-octyl acrylate (BA), and the like. And, the soft segment may include one kind of a repeat unit derived from a single acrylate-based or methacrylate-based monomer, or it may include a copolymer repeat unit derived from two or more kinds of acrylate-based or methacrylate-based monomers, i.e., two or more kinds of repeat units.

Furthermore, the diblock copolymer may have a number average molecular weight of about 5000 to 200000, or about 10000 to 100000. And the soft segment included in the diblock copolymer may have a number average molecular weight of about 3000 to 100000, or about 5000 to 80000. And, the diblock copolymer may include about 20 to 80 mole %, or about 30 to 70 mol % of the hard segments, and about 80 to 20 mol %, or about 70 to 30 mol % of the soft segments.

As the diblock copolymer satisfies the above molecular weight and each segment content ranges, a polymer thin film including a regular nanostructure or nanopatterns may be formed by treating the diblock copolymer by solvent annealing or heat treatment, which may be appropriately applied for formation of nanopatterns of various devices.

And, the crystalline hard segment and diblock copolymer including the same may have a melting point ($T_m$) of about 200 to 300° C. or about 220 to 280° C. And, the amorphous soft segment may have a glass transition temperature (Tg) of about 105 to 130° C. or about 110 to 120° C. As the hard segment and the soft segment have the above melting point and glass transition temperature ranges, a polymer thin film including a regular nanostructure or nanopatterns may be preferably formed.

Meanwhile, according to another embodiment of the invention, there is provided a method for preparing a diblock copolymer comprising conducting RAFT polymerization of a reactant comprising at least one kind of (meth)acrylate-based monomer of the following Chemical Formula 3, in the presence of a radical initiator and a RAFT reagent; and conducting RAFT polymerization of a reactant comprising at least one kind of monomer of the following Chemical Formula 4, in the presence of the above polymerization product and a radical initiator:

[Chemical Formula 3]

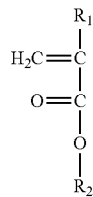

[Chemical Formula 4]

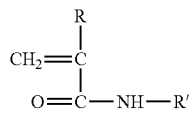

In the above Chemical Formulae 3 and 4, $R_1$, $R_2$, R and R' are as defined in the Chemical Formulae 1 and 2.

As explained, a diblock copolymer according to one embodiment may be easily prepared by conducting RAFT polymerization of the (meth)acrylate-based monomers of the Chemical Formula 3 to form polymer blocks making up the soft segments, and conducting RAFT polymerization of the acrylamide-based monomers of the Chemical Formula 4, in the presence of the above formed polymer blocks. Namely, if the first RAFT polymerization is progressed, the monomers of the Chemical Formula 3 are polymerized to prepare a polymer including a RAFT reagent bonded to both ends thereof. Subsequently, if RAFT polymerization of the monomers of the Chemical Formula 4 is progressed using the above polymer as a macroinitiator, the monomers of the Chemical Formula 4 are polymerized and bonded to the end of the macroinitiator, and as the result, a diblock copolymer including a hard segment and a soft segment according to the above explained embodiment may be prepared.

As explained, the diblock copolymer and a polymer thin film including the same may exhibit a property that on one of the hard segments or soft segments, the other segments are regularly arranged in cylindrical forms, and the like, due to the self-assembling property and crystallinity of the hard segment formed by polymerization of the monomers of the Chemical Formula 4. Therefore, a polymer thin film wherein the cylindrical forms are regularly arranged in a square (or rectangular) shape, and the like may be manufactured using the diblock copolymer, and applied for a micropattern formation of various electronic devices or manufacture of a nano bio sensor.

Hereinafter, each step of the preparation method of the diblock copolymer will be explained in further detail.

First, in the preparation method, as the monomer of the Chemical Formula 3, any widely known (meth)acrylate-based monomer may be used, specific examples thereof may include methyl acrylate (MA), methyl methacrylate (MMA), ethyl acrylate (EA), ethyl methacrylate (EMA), n-butyl acrylate (BA) or n-octyl acrylate (BA), and the like, and two or more kinds of the monomers may be used.

And, as the monomer of the Chemical Formula 4, any monomer satisfying the structure of the Chemical Formula 4 may be used, specific examples thereof may include N-(p-dodecyl)phenyl acrylamide (DOPAM), N-(p-tetradecyl)phenyl acrylamide (TEPAM), N-(p-hexadecyl)phenyl acrylamide (HEPAM), N-(p-dodecyl)naphthyl acrylamide (DONAM), N-(p-tetradecyl)naphthyl acrylamide (TENAM), N-(p-hexadecyl)naphthyl acrylamide (HENAM), N-(p-dodecyl)azobenzenyl acrylamide (DOAZAM), N-(p-tetradecyl)azobenzenyl acrylamide (TEAZAM), N-(p-hexadecyl)azobenzenyl acrylamide (HEAZAM), or N-[4-(3-(5-(4-dodecyl-phenylcarbamoyl)pentyl-carbamoyl)-propyl)phenyl acrylamide (DOPPPAM), and the like, and two or more kinds of the monomers may be used.

And, the monomer of the Chemical Formula 4 may have the above explained monoclinic crystal structure, for example, a monoclinic single crystal form. After obtaining the monomer in the form of a monoclinic single crystal, a hard segment and a diblock copolymer are formed through RAFT polymerization, and the like, and thereby, the monomer molecules may be more regularly arranged and well-oriented monomer molecules may be bonded. As the result, more regular spaces may be defined in the hard segments, and the soft segments may be regularly arranged in the spaces, and thus, a diblock copolymer having a more regular nanostructure and nanopatterns, and a polymer thin film may be manufactured.

To obtain the monomer of the Chemical Formula 4 in the form of a single crystal, after monomer synthesis, an agent for crystal growth may be added in a polar solvent and/or non-polar solvent to grow single crystal. At this time, the growth rate of the single crystal may be determined depending on the composition and ratio of the polar solvent and non-polar solvent, crystal growth time and temperature, chemical structure and concentration of the added crystal growth agent, and the like.

Meanwhile, in the method according to another embodiment, first, RAFT polymerization of a reactant including at least one kind of the (meth)acrylate-based monomer of the Chemical Formula 3 is conducted in the presence of a radical initiator and a RAFT reagent. As the result, a kind of a macroinitiator may be obtained wherein the RAFT reagent is bonded to both ends of the (meth)acrylate-based polymer of the monomers of the Chemical Formula 3.

At this time, the radical initiator, RAFT reagent and monomers of the Chemical Formula 3, and the like may be prepared as a reaction solution in an organic solvent, and the RAFT polymerization process may be progressed in the reaction solution state. The organic solvent may include at least one halogen-based or aromatic solvent selected from the group consisting of methylenechloride, 1,2-dichloroethane, chlorobenzene, dichlorobenzene, benzene and toluene, and the like, or one or two or more kinds of a polar solvent selected from the group consisting of acetone, chloroform, tetrahydrofurane (THF), dioxane, monoglyme, diglyme, dimethylformamide (DMF), dimethylsulfoxide (DMSO), and dimethylacetamide (DMAC), and the like. The organic solvent may be used in an amount of about 2 to 10 times of the weight of the monomers of the Chemical Formula 3. The organic solvent may also be used as a reaction medium in the RAFT polymerization of the monomers of the Chemical Formula 4, to be explained later.

As the radical initiator, any initiators known to be usable in radical polymerization may be used without specific limitations. Specific examples thereof may include azobisisobutyronitrile (AIBN), 2,2'-azobis-(2,4-dimethylvaleronitrile, benzoyl peroxide (BPO) or di-t-butyl peroxide (DTBP), and the like, and two or more kinds thereof may be used. The radical initiator may also be used in the RAFT polymerization of the monomers of the Chemical Formula 4, to be explained later.

The RAFT reagent may include a thermal decomposition initiator such as S-1-dodecyl-S'-($\alpha,\alpha'$-2-dimethyl-$\alpha$"-acetic acid)trithiocarbonate, cyanoisopropyl dithiobenzoate, cumyl thiobenzoate, cumyl phenylthioacetate, 1-phenylethyl-1-phenyldithioacetate, or 4-cyano-4-(thiobenzoylthio)-N-succinimide valerate, and a mixture of two or more kinds thereof may be used.

The RAFT reagent may be used in the ratio of about 0.001 to 5.0 mol % of the weight of the monomers of the Chemical Formula 3, and the radical initiator may be used in the mole equivalent of about 0.1 to 1.0 of the RAFT reagent. Using the radical initiator and RAFT reagent in the above contents, RAFT polymerization may be effectively progressed.

If the RAFT polymerization of the monomers of the Chemical Formula 3 is progressed, a kind of a macroinitiator may be obtained wherein the RAFT reagent is bonded to both ends of the (metha)acrylate-based polymer of the monomers of the Chemical Formula 3. The macroinitiator may have a molecular weight corresponding to the molecular weight of the soft segments of finally prepared diblock copolymer, and it may have a number average molecular weight of about 3000 to 100000, or about 5000 to 50000.

After the RAFT polymerization of the Chemical Formula 3, RAFT polymerization of the monomers of the Chemical Formula 4 is progressed in the presence of the polymerization product, namely, the above macroinitiator, and a radical initiator. The RAFT polymerization may be progressed using the same kinds and amounts of the radical initiator and organic solvent as used in the first RAFT polymerization, except that the above explained macroinitiator is used instead of the RAFT reagent. As the result, the monomers of the Chemical Formula 4 are polymerized to form a hard segment, and the hard segment is bonded to both ends of the macroinitiator to prepare a diblock copolymer according to one embodiment. More specifically, after the RAFT polymerization of the Chemical Formula 3, the macroinitaitor, a radical initiator, monomers of the Chemical Formula 4, and an organic solvent are uniformly mixed to form a solution, oxygen is removed in the solution under nitrogen atmosphere, and then, RAFT polymerization of the monomers of the Chemical Formula 4 is progressed.

In the above explained preparation method, each RAFT polymerization process of the monomers of the Chemical Formulae 3 and 4 may be progressed at a reaction temperature of about 60 to 140° C. And, the RAFT polymerization process may be progressed for about 30 to 200 hours, more specifically, about 50 to 170 hours.

After progressing the RAFT polymerization of the monomers of the Chemical Formula 4, a step of precipitating the polymerization product in a non-solvent may be further progressed. As the result, a diblock copolymer according to one embodiment may be obtained with high purity. As the non-solvent, any solvent that does not dissolve the above explained polymerization product (for example, polymer corresponding to each segment and diblock copolymer) may be used. Specific examples of the non-solvent may include a polar solvent such as methanol, ethanol, normal propanol, isopropanol, or ethylene glycol, or a non-polar solvent such as normal hexane, cyclohexane, normal heptanes, or petroleum ether, and a mixed solvent of two or more kinds thereof may be used.

Meanwhile, according to yet another embodiment of the invention, a polymer thin film including the above diblock copolymer and a manufacturing method thereof are provided. First, the polymer thin film includes the diblock copolymer according to one embodiment, wherein on one of the hard segments or soft segments, the other segments may be regularly arranged in cylindrical forms or spherical forms, and the like. And, a method for manufacturing the polymer thin film includes coating a solution of the diblock copolymer on a substrate to form a thin film; and solvent-annealing the coated thin film in a mixed solvent of a non-polar solvent or a polar solvent, or heat-treating it respectively at a melting point of the hard segment and a glass transition temperature of the soft segment.

Hereinafter, a method for manufacturing a polymer thin film and a polymer thin film manufactured thereby according to yet another embodiment will be explained in further detail.

As explained, the diblock copolymer according to one embodiment may be manufactured in the form of a polymer thin film including a nanostructure or nanopatterns wherein on one of the hard segments or soft segments, the other segments are regularly arranged, due to crystallinity and self-assembling property of the hard segment and the monomers forming the same, and micro-phase separation between the segments. More specifically, by preparing the diblock copolymer according to the above explained another embodiment, dissolving it in an organic solvent and coating it on a substrate using a spin coater, and the like, and solvent-annealing or heat-treating the coated thin film, a polymer thin film may be manufactured wherein on one of the hard segments or soft segments, the other segments are regularly arranged in cylindrical forms or spherical forms, and the like.

Particularly, by controlling the conditions of solvent annealing or heat treatment, the cylindrical patterns arranged in the polymer thin film may be regularly arranged in various shapes such as a lamellar, square (or rectangular) or hexagonal shape, and the like, as seen from one plane of the polymer thin film (for example, the top of the polymer thin film horizontal to the substrate or one side of the polymer thin film vertical to the substrate). For example, as seen from one side of the polymer thin film, it may be regularly arranged in a lamellar shape, or as seen from the top or one side of the polymer thin film, it may be arranged in a square (or rectangular) or hexagonal shape, and the like. Using the polymer thin film, cylindrical segments, for example, nanopatterns of the soft segments may be selectively decomposed and removed by UV irradiation, and the other segments on the substrate, for example, the hard segments, may be used as a mask to etch the lower film (a film to be patterned on the substrate) thereby patterning to a desired shape. Furthermore, nanopatterns arranged in a square (or rectangular) shape, which was difficult to embody using the existing block copolymers, may also be easily formed, and thus, the polymer thin film may be appropriately applied for a micropattern formation process of various electronic devices including a next generation semiconductor device, or manufacture of a nano bio sensor, and the like.

To form the polymer thin film, first, a diblock copolymer according to one embodiment is dissolved in an organic solvent and coated on a substrate. The diblock copolymer may have a number average molecular weight of about 5000 to 200000, or about 10000 to 100000. And, the diblock copolymer may include about 20 to 80 mol %, or about 30 to 70 mol % of the hard segments, and about 80 to 20 mol %, or 70 to 30 mol % of the soft segments.

As the diblock copolymer satisfies the above molecular weight and each segment content ranges, it may be treated by solvent annealing or heat treatment to form a polymer thin film including a regular nanostructure or nanopatterns.

As the organic solvent, at least one kind selected from a non-polar or polar solvent such as n-hexane, n-heptane, n-octane, cyclohexane, methylenechloride, 1,2-dichloroethane, chloroform, ethylether, benzene, chlorobenzene, dichlorobenzene, toluene, THF, acetone, dioxane, methanol, ethanol, ethylacetate, DMF, DMAC, or DMSO may be used. The amount of the organic solvent may be appropriately about 10 time or more of the weight of the diblock copolymer.

And, to coat the organic solution of the diblock copolymer to a uniform thickness, the organic solution may be spin coated on a substrate by spin coater, and the like to form a thin film. At this time, the rotation number and time of the spin coater are important as well as the kind and concentration of the solvent, and considering this, the rotation number and time may be respectively controlled to about 2000-4000 rpm and about 20-60 seconds.

Meanwhile, after coating the solution of the diblock copolymer, the thin film is solvent annealed or heat treated. For solvent annealing, the same organic solvent as used for dissolving the diblock copolymer may be used, but a mixed solvent of two or more kinds respectively selected from a non-polar solvent and a polar solvent may be preferably used. And, the solvent annealing may be progressed at room temperature for about 4 to 96 hours. And, the heat treatment may be conducted at a melting point ($T_m$) of the repeat unit of the Chemical Formula 1 making up the hard segment, and a glass transition temperature ($T_g$) of the repeat unit of the Chemical Formula 2 making up the soft segment, respectively for about 2 to 24 hours. By progressing the solvent annealing or heat treatment under the above explained conditions, more regular soft segment nanostructure or nanopatterns may be formed on a polymer thin film.

Furthermore, by controlling the conditions of the solvent annealing or heat treatment, the arrangement form of the cylindrical nanopatterns may be controlled to various shapes such as a lamellar shape, a square (or rectangular) shape or a hexagonal shape, and the like. To uniformly arrange the nanopatterns to a desired shape, a molecular weight of the diblock copolymer or a chemical structure or compositional ratio of each segment may be appropriately controlled.

Meanwhile, according to yet another embodiment of the invention, a method for forming nanopatterns using the above explained polymer thin film is provided. The method for forming nanopatterns may include forming a polymer thin film on a substrate on which a film to be patterned is formed, by the above explained method; selectively removing either segments arranged in cylindrical forms or spherical forms in the polymer thin film; and conducting RIE of a film to be patterned using the polymer thin film from which either segments are removed as a mask. One example of the nanopattern forming method may include forming a polymer thin film on a substrate on which a film to be patterned is formed, by the above explained method; irradiating UV to the polymer thin film to remove the soft segments; and conducting RIE of a film to be patterned using the polymer thin film from which the soft segments are removed as a mask.

Through the method, a film to be patterned on a substrate may be easily micro-patterned along the nanopatterns formed on the polymer thin film, without using an auxiliary metallic mold such as a photo mask, and the like.

In the nanopattern forming method, first, UV is irradiated to the polymer thin film to decompose either segments arranged in cylindrical form or spherical form, for example, soft segments, and subsequently, the decomposed segments may be removed by solvent treatment or acid treatment, and the like. The UV irradiation may be progressed by irradiating UV of 254 nm wavelength at about 5 to 50 Joule per unit area ($cm^2$), and acid such as acetic acid or trifluoroacetic acid, and the like may be treated to remove the UV decomposed segments.

If one of the hard segments or soft segments are removed, the other segments, for example, hard segments remains on the polymer thin film, thus exposing a film to be patterned on the substrate on the part where the nanopatterns of the segments have been formed in cylindrical forms, and the like. Therefore, if RIE is conducted on the film to be patterned using the polymer thin film as a mask, a film to be patterned may be selectively etched and removed only in the exposed parts, thus patterned in a desired pattern.

The RIE may be progressed, for example, under general conditions (40/20 SCCM, 80 Watt, 1-10 minutes) of $CF_4$/Ar gas ion, and in this case, the film to be patterned may be a thin film including silicon.

After the RIE, a step of treating with oxygen plasma to remove the polymer thin film may be further progressed, so that a polymer thin film (for example, hard segment) remaining on the patterned film may be removed. The oxygen plasma may be treated under common conditions, for example, about 40 sccm; about 50 W; about 1-10 minutes, and as the result, cylindrical nanopatterns arranged in a lamellar, square (or rectangular), or hexagonal shape may be transcribed onto the film to be patterned including the silicon, and the like, to form a desired nanostructure.

Advantageous Effect of the Invention

As explained, according to the present invention, a novel diblock copolymer including an acrylamide-based hard segment and a (meth)acrylate-based soft segment, a polymer thin film including the same, and a method of preparing the same are provided. The diblock copolymer and the polymer thin film may facilitate formation of a nanostructure or nanopatterns wherein on one of the soft segments or hard segments, the other segments are regularly arranged in cylindrical forms, and the like.

Particularly, simply by controlling the conditions for polymer thin film formation (for example, solvent annealing condition or heat treatment condition, and the like) to control polymer morphology, a nanostructure may be formed wherein cylindrical nanopatterns and the like are arranged in a desired shape such as a lamellar shape, a square (or rectangular) shape or a hexagonal shape, and the like, and particularly, cylindrical nanopatterns arranged in a square (or rectangular) shape, which was difficult to be formed, may be easily formed.

Therefore, by selectively removing soft segments in the polymer thin film with UV, and the like, and conducting RIE of a lower film to be patterned using the polymer thin film as a mask, the film to be patterned may be very easily patterned in a desired shape.

Accordingly, using the polymer thin film, much finer patterns may be easily formed than could be formed by the existing photolithography, and particularly, patterns arranged in a square (or rectangular) shape, which was difficult to be formed with other block copolymers, may be relatively easily formed. Thus, it is confirmed that the diblock copolymer and the polymer thin film may be appropriately applied for a micropattern forming process of various electronic devices including a next generation semiconductor device, or manufacture of a nano biosensor, and the like.

DETAILS FOR PRACTICING THE INVENTION

Figure 1A:
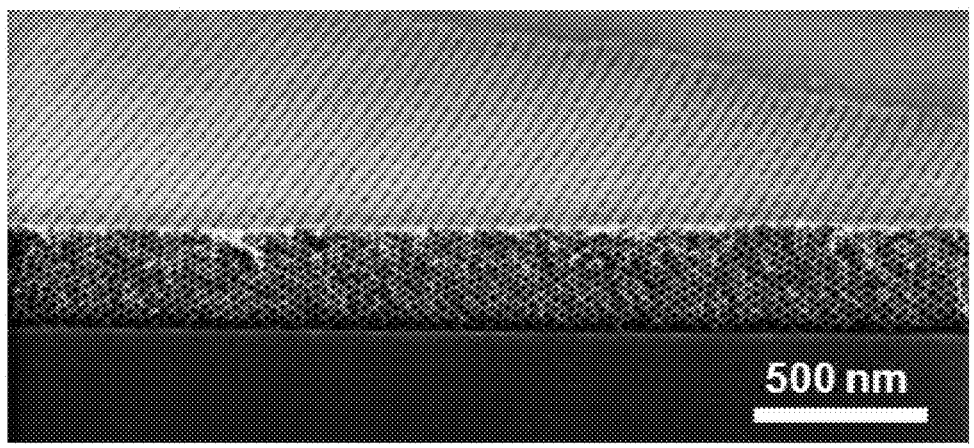
FIG. 1a is the SEM photograph of the surface and the cross-section of the cut nanostructure on the polymer thin film formed in Example 12.

Hereinafter, the function and effect of the invention will be explained in further detail with reference to the following examples. However, it is to be understood that these examples are only to illustrate the invention and are not intended to limit the scope of the invention.

Examples 1 and 2

Synthesis of Acrylamide-Based Monomer and Identification of Crystallinity

Example 1

Synthesis of p-Dodecylphenylacrylamide (DOPAM) and Preparation of Single Crystal Firstly, p-dodecylaniline (12 g, 0.046 mol) was dissolved in a THF solvent (100 mL). The solution was poured into a 100 mL three-necked round flask, and an acid scavenger containing imidazole and triethyl amine at the same mole fraction (0.023 mol) was added dropwise through a funnel for 10 minutes. Under nitrogen atmosphere, a solution containing acryloyl chloride (3.8 mL, 0.047 mol) in THF (20 mL) was gradually added dropwise to the mixed solution through a dropping funnel for 20 minutes. Meanwhile, the solution was cooled on an ice bath to prevent the temperature of the reaction mixture from rising above 5° C. After 6 hours of reaction at 0° C., the solution was kept at 25° C. for more 9 hours of reaction. Upon completion of the reaction, the solution was passed through a filter paper to eliminate precipitated salts, and the solvent was evaporated from the filtrate on an evaporator. The solid thus obtained was dissolved in dichloromethane (100 mL) and added to a separatory funnel along with 10% aqueous $NaHCO_3$ solution (50 mL). The funnel was shaken vigorously and set aside to allow for the complete separation of the aqueous phase and thereby to remove unreacted acryloyl chloride. Magnesium sulfate (1.0 g) was added to the separated dichloromethane solution. After stirred for 5 hours, the solution was subjected to filtration to remove a trace amount of water dissolved in the solvent. The dichloromethane solution thus obtained was evaporated, and n-hexane (100 mL) was added. The solution was stirred for 2 hours, and unreacted p-dodecyl aniline was filtered out from the solution. The filtrate was then removed of the solvent on the evaporator to yield a white solid DOPAM product (yield 95%). The chemical structure of the DOPAM product was identified by hydrogen nuclear magnetic resonance ($^1$H-NMR) spectrum. The results were as follows.

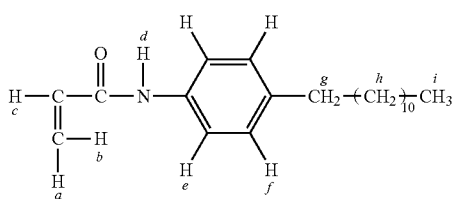

$^1$H-NMR (CDCl$_3$): e, δ7.5 (d, 2H); d, δ7.2 (s, 1H); f, δ7.15 (d, 2H); b, δ6.4 (d, 1H); c, δ6.2 (q, 1H); b, δ5.8 (d, 1H); g, δ2.6 (t, 2H); h, δ1.25-1.35 (m, 20H); i, δ0.935 (t, 3H).

The DOPAM product ($T_m$=101° C.) was purified by re-crystallization with ethanol three times. The purified DOPAM was added to a THF solvent, and several drops of a non-polar solvent were added. The solution was kept below −10° C. for a defined period of time to grow single crystals of the monomer. It is confirmed that the growth rate of the single crystals was dependent on the composition and ratio of polar and non-polar solvents, crystal growth time and temperature, and the structure and concentration of the crystal growth agent added.

XRD (X-Ray Diffractometry) was used to identify the crystal structure of the single crystals obtained in Example 1. The crystallographic data thus obtained is presented in Table 1, which shows that the single crystals of the monomer of Example 1 have a monoclinic crystal structure.

TABLE 1

| Crystallographic Data for Single Crystals of Monomer of Example 1 | |
|---|---|
| Empirical formula | C$_{21}$H$_{33}$N$_1$O$_1$ |
| Formula weight | 315.48 |
| Temperature [K] | 293(2) K |
| Wavelength [Å] | 0.71073 |
| Crystal system, space group | Monoclinic, P2$_1$/c |
| a [Å] | 4.7055(13) |
| b [Å] | 43.315(16) |
| c [Å] | 9.4150(19) |
| β [°] | 95.158(19) |
| Volume [Å$^3$] | 1911.2(10) |
| d$_{calcd}$ [gcm$^{-3}$] | 1.096 |
| μ [mm$^{-1}$] | 0.066 |
| F(000) | 696 |
| Crystal size [mm] | 0.55 × 0.30 × 0.25 |
| θ range [°] | 1.88-26.33 |
| Data/parameters | 1845/213 |
| GOF on F$^2$ | 1.111 |
| R1, wR2 [I > 2σ(I)] | 0.0975, 0.2551 |
| Largest diff. peak and hole [e.Å$^{-3}$] | 0.358 and −0.343 |

Example 2

Synthesis of p-Tetradecylphenylacrylamide (TEPAM) and p-hexadecylphenylacrylamide (HEPAM) and Preparation of Single Crystal TEPAM and HEPAM were synthesized with the yields of 90% and 93%, respectively in the same manner as described in Example 1, except that p-tetradecylaniline having 14 carbon atoms or p-hexadecylaniline having 16 carbon atoms was used instead of p-dodecylaniline having 12 carbon atoms. The single crystals of TEPAM and HEPAM were grown and identified by XRD analysis in the same manner as described in Example 1, confirming that the single crystals had a monoclinic crystal structure.

Examples 3 to 11

Preparation of Diblock Copolymer

Example 3

Preparation of Macroinitiator (Macro-PMMA)-1

6.0 g of monomers MMA, 66.3 g of a RAFT reagent cyanoisopropyldithiobenzoate, 24.6 mg of a radical initiator AIBN, and 6.82 mL of benzene were poured into a glass ampoule, and oxygen was removed from the solution by freeze-thawing, and then, the ampoule was sealed, and RAFT polymerization was conducted in an oil container of 60° C. for 24 hours. After polymerization, the reaction solution was precipitated in 200 mL of an extraction solvent methanol, filtered under reduced pressure, and dried to prepare a pink macroinitiator(Macro-PMMA)-1 wherein the RAFT reagent is bonded to both ends of polymer of MMA (PMMA). The polymerization conversion, number average molecular weight ($M_n$), molecular weight distribution ($M_w/M_n$) and glass transition temperature ($T_g$) were 90%, 18400, 1.11 and 117° C., respectively.

Example 4

Preparation of Nobel Diblock Copolymer-1

0.781 g of the acrylamide-based monomers DOPAM synthesized in Example 1, 0.450 g of the macroinitator-1 prepared in Example 2, 4.0 mg of BPO, and 4.05 mL of benzene were poured into a 10 mL Schlenk flask, stirred at room temperature for 30 minutes under nitrogen atmosphere, and then, RAFT polymerization was conducted at a silicon oil container for 72 hours. The polymer solution was precipitated in 200 mL of methanol, and then, dried to prepare a novel light yellow diblock copolymer-1. The polymerization conversion, number average molecular weight ($M_n$), molecular weight distribution ($M_w/M_n$) and melting temperature ($T_m$) were 40%, 30900, 1.23, 119° C., 233° C., respectively.

Example 5

Preparation of Novel Diblock Copolymer-2

A novel light yellow diblock copolymer-2 was prepared in the same manner as Example 4, except that 0.621 g of DOPAM, 0.3 g of the macroinitiator-1, 1.82 mg of AIBN, and 3.22 mL of benzene were used, and that RAFT polymerization was conducted at 70° C. for 72 hours. The polymerization conversion, number average molecular weight ($M_n$), molecular weight distribution ($M_w/M_n$), $T_g$ and $T_m$ were 58%, 40400, 1.25, 119° C., and 236° C., respectively.

Example 6

Preparation of Novel Diblock Copolymer-3

A novel light yellow diblock copolymer-3 was prepared in the same manner as Example 5, except that 0.841 g of DOPAM, 1.84 mg of AIBN, and 4.36 mL of benzene were used. The polymerization conversion, number average molecular weight ($M_n$), molecular weight distribution ($M_w/M_n$), $T_g$ and $T_m$ were 57%, 46700, 1.25, 119° C., and 235° C., respectively.

Example 7

Preparation of Macroinitiator(Macro-PMMA)-2

A pink macroinitiator-2 was prepared in the same manner as Example 3, except that polymerization was conducted for 30 hours. The polymerization conversion, number average molecular weight, molecular weight distribution, and $T_g$ were 95%, 19400, 1.11, 119° C., respectively.

Example 8

Preparation of Novel Diblock Copolymer-4

A novel light yellow diblock copolymer-4 was prepared in the same manner as Example 5, except that 0.732 g of the acrylamide-based monomers DOPAM synthesized in Example 1, 0.45 g of the macroinitiator-2 prepared in Example 7, 2.54 mg of AIBN, and 3.79 mL of benzene were used. The polymerization conversion, number average molecular weight ($M_n$), molecular weight distribution ($M_w/M_n$), $T_g$ and $T_m$ were 66%, 40400, 1.25, 119° C., and 234° C., respectively.

Example 9

Preparation of Novel Diblock Copolymer-5

A novel light yellow diblock copolymer-5 was prepared in the same manner as Example 5, except that 0.976 g of the monomers DOPAM, 0.3 g of the macroinitiator-2, 1.70 mg of AIBN, and 5.51 mL of benzene were used. The polymerization conversion, number average molecular weight ($M_n$), molecular weight distribution ($M_w/M_n$), $T_g$ and $T_m$ were 56%, 54900, 1.30, 119° C., and 236° C., respectively.

Example 10

Preparation of Novel Diblock Copolymer-6

A novel light yellow diblock copolymer-6 was prepared in the same manner as Example 9, except that 1.220 g of DOPAM, and 6.32 mL of benzene were used. The polymerization conversion, number average molecular weight ($M_n$), molecular weight distribution ($M_w/M_n$), $T_g$ and $T_m$ were 65%, 70800, 1.30, 119° C., 236° C., respectively.

Example 11

Preparation of Novel Diblock Copolymer-7

A novel light yellow diblock copolymer-7 was prepared in the same manner as Example 9, except that 1.216 g of TEPAM and 6.32 mL of benzene were used. The polymerization conversion, number average molecular weight ($M_n$), molecular weight distribution ($M_w/M_n$), $T_g$ and $T_m$ were 57%, 60700, 1.31, 119° C., and 230° C., respectively.

For the macroinitiators and novel diblock copolymers prepared by RAFT polymerization in Examples 3 to 11, polymerization conditions, conversion, molecular weight, Tg, Tm, and the like are summarized in the following Table 2.

TABLE 2

Polymerization conditions and properties of the macroinitiators and diblock copolymers of Examples 3 to 11

| | Polymerization conditions | | Polymerization results | | | | | | |
| --- | --- | --- | --- | --- | --- | --- | --- | --- | --- |
| | | | Polymerization conversion (%) | Compositional ratio (mol %)[1] | | Molecular | | | |
| | Temperature (° C.) | Time (h) | | Soft segment (PMMA) | Hard segment (PDPAA) | Molecular weight[2] ($M_n$) | weight distribution | $T_g$ (° C.) | $T_m$ (° C.) |
| Example 3 (macroinitiator) | 60 | 24 | 90 | 100 | 0 | 18300 | 1.11 | 117 | — |
| Example 4 | 80 | 72 | 40 | 59 | 41 | 30900 | 1.23 | 119 | 234 |
| Example 5 | 70 | 72 | 58 | 45 | 55 | 40400 | 1.25 | 119 | 236 |
| Example 6 | 70 | 72 | 57 | 39 | 61 | 46700 | 1.25 | 118 | 235 |
| Example 7 (macroinitiator) | 60 | 24 | 95 | 100 | 0 | 19400 | 1.11 | 119 | — |
| Example 8 | 70 | 72 | 66 | 48 | 52 | 40400 | 1.25 | 119 | 234 |
| Example 9 | 70 | 72 | 56 | 35 | 65 | 54900 | 1.30 | 119 | 236 |
| Example 10 | 70 | 72 | 65 | 27 | 73 | 70800 | 1.30 | 119 | 236 |
| Example 11 | 70 | 72 | 57 | 32 | 68 | 60700 | 1.31 | 119 | 230 |

[1]The compositional ratio of the soft segment and the hard segment in diblock copolymer was confirmed by GPC.
[2]measured by GPC using a 25° C. THF solution.

Examples 12 to 18

Manufacture of Polymer Thin Film and Identification of Nanopattern Shape

Example 12

Manufacture of Polymer Thin Film-1 by Solvent Annealing and Identification of the Shape of Nanopattern The diblock copolymer-1 containing 41 mol % of hard segments, which was prepared in Example 4, was dissolved in a chloroform solvent to prepare a 1.0 wt % solution thereof, which was then coated on a substrate of a silicon wafer at 2000 rpm for 60 seconds using a spin coater to form a polymer thin film. The thin film was put in a desiccator that is maintained under atmosphere of the stream of a mixed solvent of THF/cyclohexane 8/2 (v/v, volume ratio), and aged for 48 hours to manifest a nanostructure on the surface of the thin film.

Figure 1B:
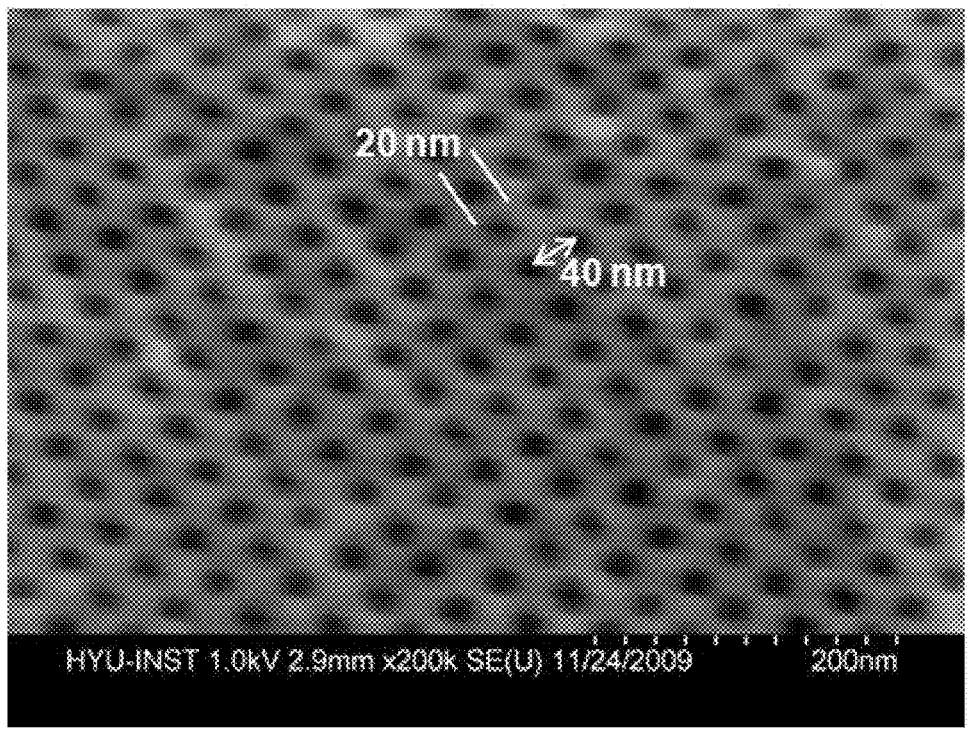
FIG. 1b is the SEM photograph of enlarged cross-section of the nanostructure on the polymer thin film formed in Example 12.

The nanostructure thus manifested was confirmed by AFM (atomic force microscopy). And, the thin film having the nanostructure was put in a container including $RuO_4$ liquid for 2 to 10 minutes to adsorb $RuO_4$ on the thin film, and then, the structure of the manifested nanostructure was measured by scanning electron microscope (SEM). The SEM photographs are shown in FIGS. 1a and 1b. FIG. 1a is the SEM photograph of the surface and the cross-section of the cut nanostructure, confirming that cylindrical nanopatterns are well-arranged in a lamellar shape on the wide surface of about 4 μm. And, FIG. 1b is the enlarged photograph of the cross-section of the SEM photograph as shown in FIG. 1a, confirming that black cylindrical nanopatterns with a diameter of about 20 nm and a distance of about 40 nm are regularly arranged in a two-dimensional square (or rectangular) shape.

Example 13

Manufacture of Polymer Thin Film-2 by Solvent Annealing and Identification of the Shape of Nanopattern A thin film was manufactured in the same manner as Example 12, except using the diblock copolymer-2 containing 55 mol % of hard segments, prepared in Example 5, and a nanostructure was manifested on the surface of the thin film.

Figure 2A:
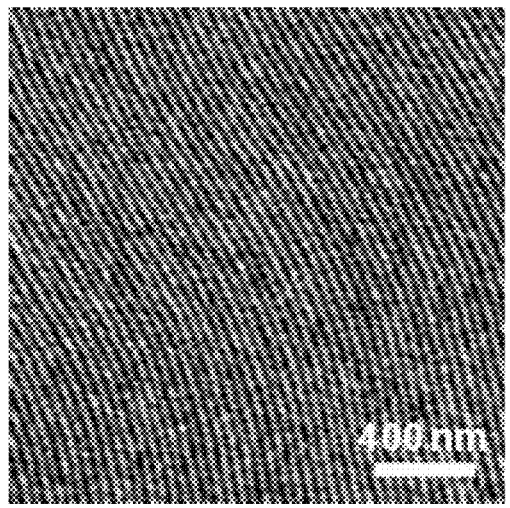
FIG. 2a is the AFM photograph of the nanostructure on the surface of the polymer thin film formed in Example 13.
Figure 2B:
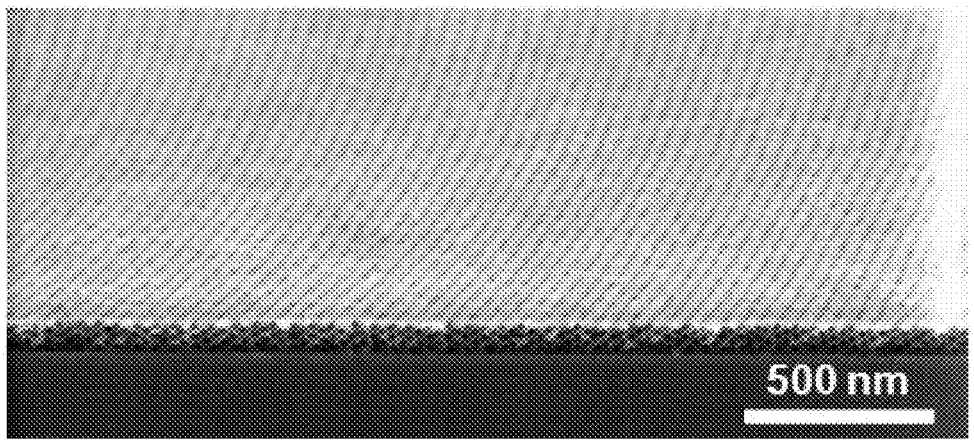
FIG. 2b is the SEM photograph of the surface and the cross-section of the cut nanostructure on the polymer thin film formed in Example 13.

The nanostructure thus manifested was confirmed by AFM (atomic force microscopy). And, the thin film having the nanostructure was put in a container including $RuO_4$ liquid for 2 to 10 minutes to adsorb $RuO_4$ on the thin film, and then, the structure of the manifested nanostructure was measured by scanning electron microscope (SEM). The measurement results are shown in FIGS. 2a and 2b. FIG. 2a is the SEM photograph the nanostructure of the surface of the thin film, confirming that nanopatterns are well-arranged in a lamellar shape. And, FIG. 2b is the SEM photograph of the surface and the cross-section of the cut nanostructure, confirming that cylindrical nanopatterns are well-arranged in a lamellar shape on the wide surface of about 3 μm.

Example 14

Manufacture of Polymer Thin Film-3 by Solvent Annealing and Identification of the Shape of Nanopattern A thin film was manufactured in the same manner as Example 12, except using the diblock copolymer-3 containing 61 mol % of hard segments, prepared in Example 6, and a nanostructure was manifested on the surface of the thin film.

Figure 3A:
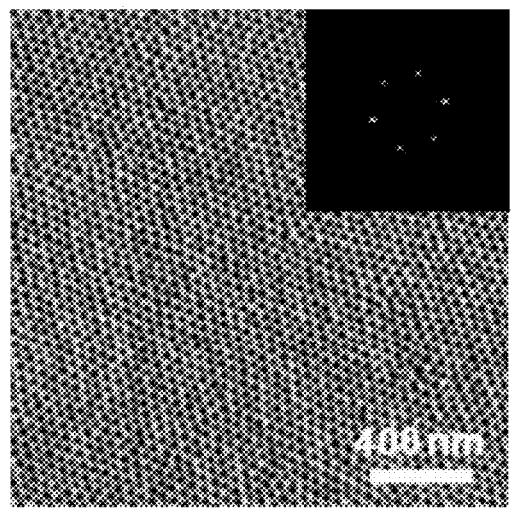
FIG. 3a is the AFM photograph of the nanostructure of the surface of the polymer thin film formed in Example 14.
Figure 3B:
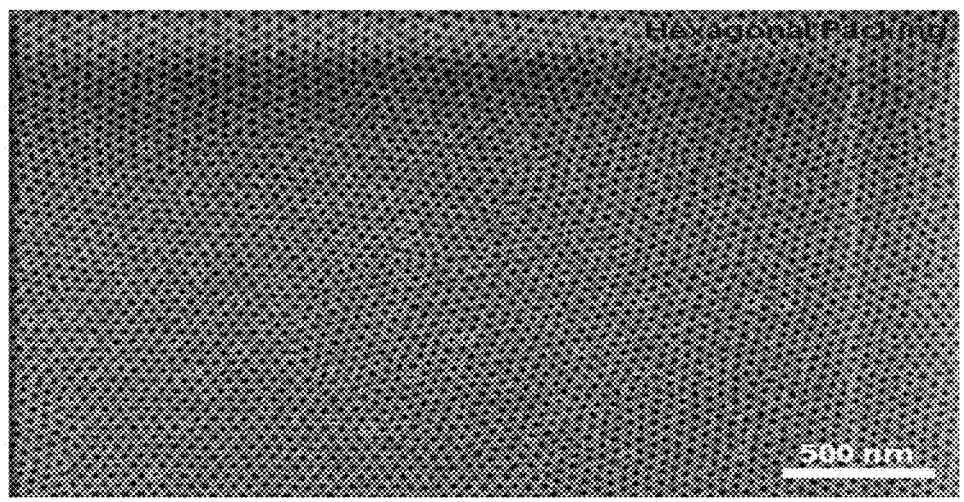
FIG. 3b is the SEM photograph of the surface of the nanostructure of the polymer thin film formed in Example 14.

The nanostructure thus manifested was confirmed by AFM (atomic force microscopy). And, the thin film having the nanostructure was put in a container including $RuO_4$ liquid for 2 to 10 minutes to adsorb $RuO_4$ on the thin film, and then, the structure of the manifested nanostructure was measured by scanning electron microscope (SEM). The measurement results are shown in FIGS. 3a and 3b. FIG. 3a is the AFM photograph the nanostructure of the surface of the thin film, confirming that cylindrical nanopatterns are well-arranged in a hexagonal shape. And, FIG. 3b is the SEM photograph of the surface of the nanostructure, confirming that cylindrical nanopatterns are well-arranged in a hexagonal shape on the wide surface of about 3 μm.

Example 15

Manufacture of Polymer Thin Film-4 by Solvent Annealing, Selective Removal of Soft Segment, and Formation and Identification of the Shape of Nanopattern The diblock copolymer-4 containing 52 mol % of hard segments, which was prepared in Example 8, was dissolved in a chloroform solvent to prepare a 1.0 wt % solution thereof, which is then coated on a silicon wafer substrate coated with $SiO_2$ at 3000 rpm for 60 seconds using a spin coater to manufacture a thin film. The manufactured thin film of the diblock copolymer-4 was put in a desiccator that is maintained under atmosphere of the stream of a mixed solvent of THF/cyclohexane 8/2 (v/v, volume ratio), and aged for 24 hours to manifest a nanostructure on the surface of the thin film.

The thin film having the nanostructure was put in a vial containing $RuO_4$ liquid to adsorb $RuO_4$ for 2 minutes, and then, irradiated with UV having a wavelength of 254 nm for 15 minutes, immersed in 10 mL of a 99.5% acetic acid solution for 20 minutes, taken out, washed with water several times, and dried to manufacture a thin film with a nanostructure wherein the soft segments of the diblock copolymer-4 are selectively removed. The thin film was used as a mask to conduct RIE under general conditions ($CF_4$/Ar=40/20 sccm; 80 W; 120 seconds), and oxygen plasma (40 sccm; 50 W; 60 seconds) was irradiated to manufacture a nano-structured body wherein the nanostructure is transcribed onto the silicon wafer substrate coated with $SiO_2$.

Figure 4A:
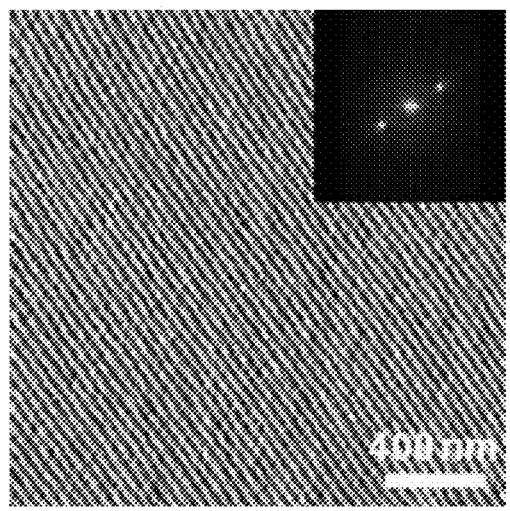
FIG. 4a is the AFM photograph of the nanostructure of the surface of the polymer thin film formed in Example 15.
Figure 4B:
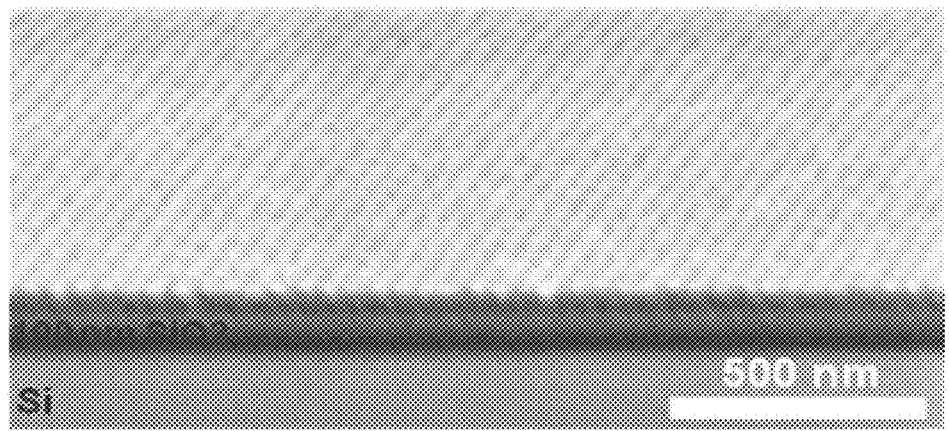
FIG. 4b is the SEM photograph of the surface of the nanostructure, after irradiating UV to the polymer thin film.
Figure 4C:
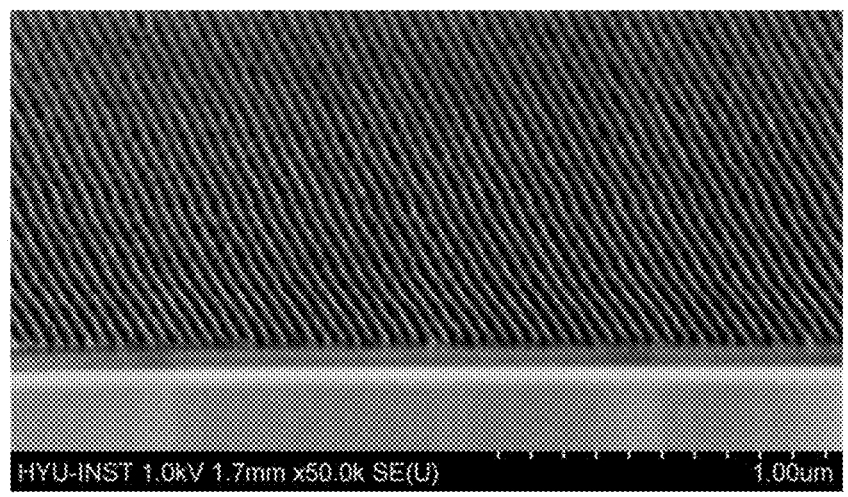
FIG. 4c is the SEM photograph of the nanostructure, after RIE and oxygen plasma treatment in Example 15.

The nano-structured body thus manufactured was confirmed by AFM (atomic force microscopy). And, the nano-structured body was put in a container including $RuO_4$ liquid for 2 to 10 minutes to adsorb $RuO_4$ on the thin film, and then, measured by scanning electron microscope (SEM). The measurement results are shown in FIGS. 4a to 4c. FIG. 4a is the AFM photograph of the nanostructure of the surface of the thin film, immediately after formation of the polymer thin film, confirming that cylindrical nanopatterns are well-arranged in a lamellar shape. And, FIG. 4b is the SEM photograph of the surface of the nanostructure immediately after UV irradiation, confirming that cylindrical nanopatterns are well-arranged in a lamellar shape on the wide surface of about 3 μm, and particularly, soft segments are selectively removed. FIG. 4c is the SEM photograph of the surface of the nanostructure after RIE and oxygen plasma treatment, confirming that nanopatterns of about 20 nm are regularly arranged in a lamellar shape at an interval of about 45 nm on the wide silicon substrate of about 2 μm.

Example 16

Manufacture of Polymer Thin Film-5 by Solvent Annealing, Selective Removal of Soft Segment, and Formation and Identification of the Shape of Nanopattern A thin film was manufactured and a nanostructure was manifested on the surface of the thin film in the same manner as Example 12, except using the diblock copolymer-5 containing 65 mol % of hard segments, prepared in Example 9. A nano-structured body having a transcribed nanostructure was manufactured by etching in the same manner as Example 15, except that UV was irradiated to the thin film for 20 minutes, 50 W RIE was conducted for 30 seconds.

Figure 5A:
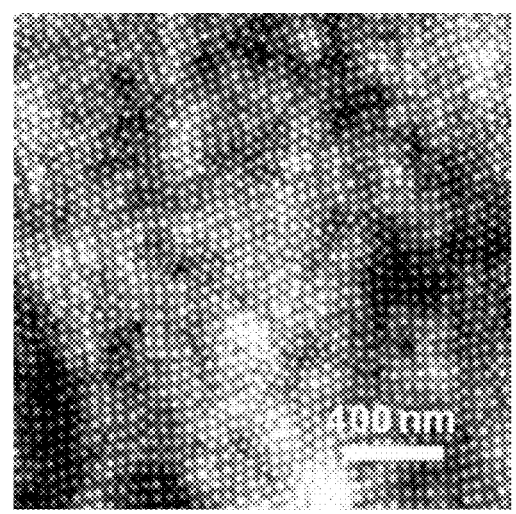
FIG. 5a is the AFM photograph of the nanostructure of the surface of the polymer thin film formed in Example 16.
Figure 5B:
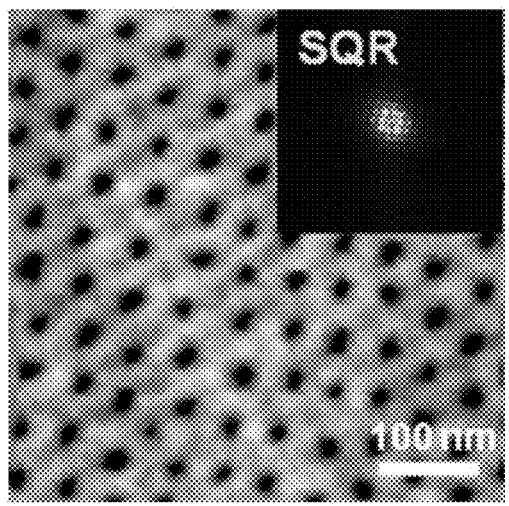
FIG. 5b is the AFM photograph of the surface of the nanostructure, after irradiating UV to the polymer thin film in Example 16.
Figure 5C:
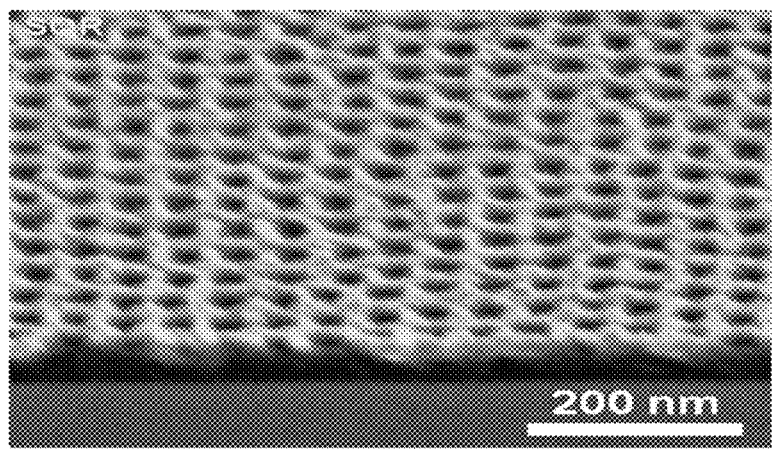
FIG. 5c is the SEM photograph of the surface of the nanostructure, after RIE or oxygen plasma treatment in Example 16.

The manufactured nano-structured body was confirmed by AFM (atomic force microscopy). And, the nano-structured body was put in a container including $RuO_4$ liquid for 2 to 10 minutes to adsorb $RuO_4$ on the thin film, and then, measured by scanning electron microscope (SEM). The measurement results are shown in FIGS. 5a to 5c. FIG. 5a is the AFM photograph of the nanostructure of the surface of the thin film immediately after formation of the polymer thin film, confirming that cylindrical nanopatterns are well-arranged in a two-dimensional square (or rectangular) shape. FIG. 5b is the AFM photograph of the surface of the nanostructure immediately after UV irradiation, confirming that black cylindrical nanopatterns having a diameter of about 20 nm and an interval of about 45 nm are well-arranged in a two-dimensional square (or rectangular) shape, and particularly, soft segments are selectively removed. FIG. 5c is the SEM photographs of the surface of the nano-structured body after RIE and oxygen plasma treatment, confirming that cylindrical nanopatterns with a diameter of about 25 nm, which are vertical to the silicon substrate, are well-arranged in a square (or rectangular) shape at an interval of about 50 nm.

Example 17

Manufacture of Polymer Thin Film-6 by Solvent Annealing, Selective Removal of Soft Segment, and Formation and Identification of the Shape of Nanopattern A thin film was manufactured and a nanostructure was manifested on the surface of the thin film in the same manner as Example 15, except using the diblock copolymer-6 containing 73 mol % of hard segments prepared in Example 10. And then, only UV etching was conducted in the same manner as Example 15 to manufacture a thin film with a nanostructure.

Figure 6A:
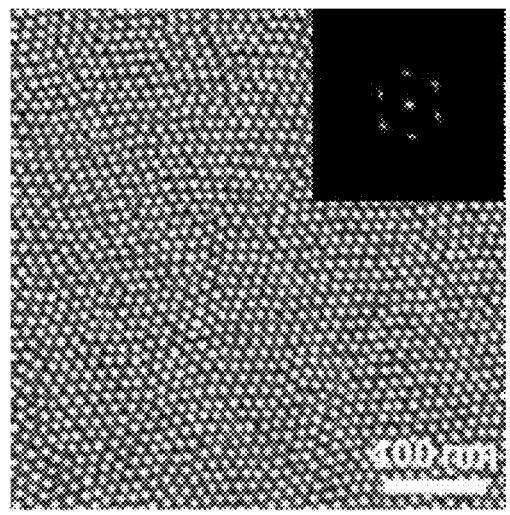
FIG. 6a is the AFM photograph of the nanostructure of the surface of the polymer thin film formed in Example 17.
Figure 6B:
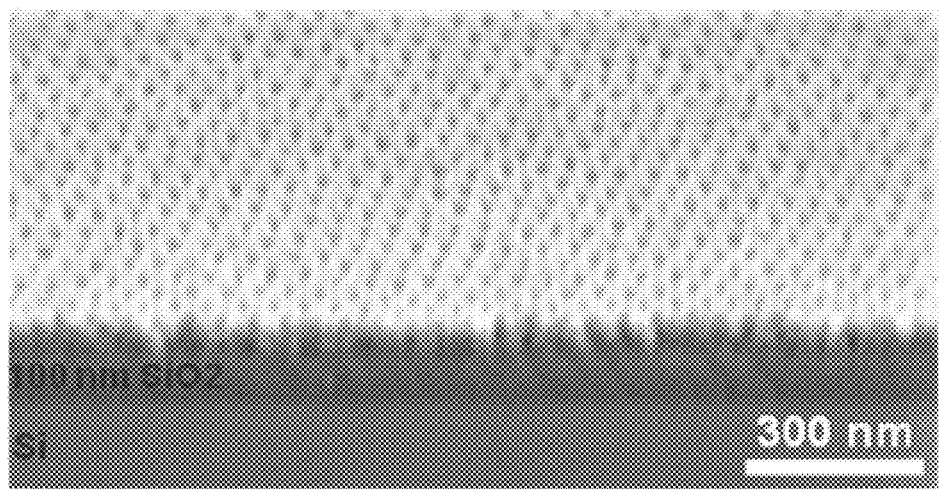
FIG. 6b is the SEM photograph of the surface of the nanostructure, after irradiating UV to the polymer thin film in Example 17.

The manufactured nano-structured body was confirmed by AFM (atomic force microscopy). And, the nano-structured body was put in a container including $RuO_4$ liquid for 2 to 10 minutes to adsorb $RuO_4$ on the thin film, and then, measured by scanning electron microscope (SEM). The measurement results are shown in FIGS. 6a to 6c. FIG. 6a is the AFM photograph of the nanostructure of the surface of the thin film immediately after polymer thin film formation, confirming that cylindrical nanopatterns are well-arranged in a hexagonal shape. FIG. 6b is the SEM photograph of the surface of the nanostructure immediately after UV irradiation, confirming that black cylindrical nanopatterns having a diameter of about 20 nm and interval of about 40 nm are well-arranged vertically on the wide silicon surface of about 2 μm, and particularly, soft segments are selectively removed.

Example 18

Manufacture of Polymer Thin Film-7 by Solvent Annealing, Selective Removal of Soft Segment, and Formation and Identification of the Shape of Nanopattern A thin film was manufactured in the same manner as Example 16, except using the diblock copolymer-7 containing 68 mol % of hard segments prepared in Example 11, and the nanostructure was manifested, and then, only UV etching was conducted in the same manner as Example 16 to manufacture a thin film with a nanostructure.

Figure 7A:
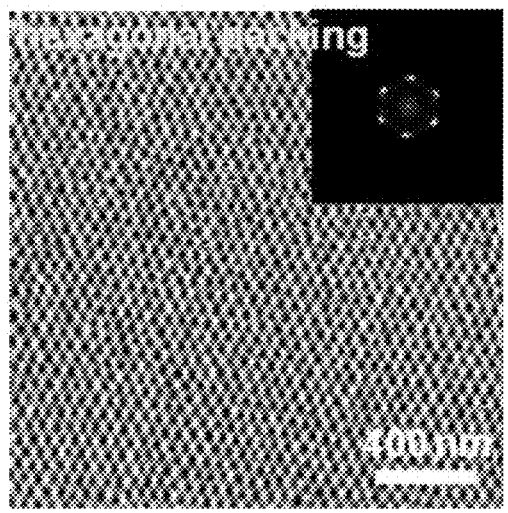
FIG. 7a is the AFM photograph of the nanostructure of the surface of the polymer thin film formed in Example 17.
Figure 7B:
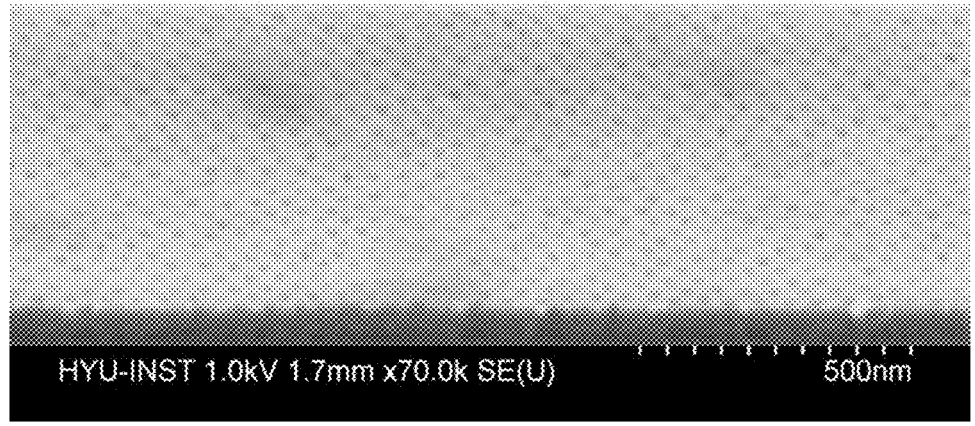
FIG. 7b is the SEM photograph of the surface of the nanostructure, after irradiating UV to the polymer thin film in Example 18.

The manufactured nano-structured body was confirmed by AFM (atomic force microscopy). And, the nano-structured body was put in a container including $RuO_4$ liquid for 2 to 10 minutes to adsorb $RuO_4$ on the thin film, and then, measured by scanning electron microscope (SEM). The measurement results are shown in FIGS. 7a to 7c. FIG. 7a is the AFM photograph of the nanostructure of the surface of the thin film immediately after polymer thin film formation, confirming that cylindrical nanopatterns are well-arranged in a hexagonal shape. FIG. 7b is the SEM photograph of the surface of the nanostructure immediately after UV irradiation, confirming that black cylindrical nanopatterns having a diameter of about 25 nm and an interval of about 50 nm are well-arranged vertically on the wide surface of silicon substrate of about 2 μm, and particularly soft segments are selectively removed.

What is claimed is:

1. A method for forming a nano pattern comprising:
    coating a solution of a diblock copolymer comprising a hard segment and a soft segment on a substrate to form a thin film;
    solvent-annealing the coated thin film to form a polymer thin film on a substrate on which a film to be patterned is formed;
    irradiating UV to the polymer thin film to remove soft segments; and
    conducting reactive ion etching of a film to be patterned using the polymer thin film from which the soft segments are removed as a mask;
    wherein the hard segment comprises at least one repeat unit of the following Chemical Formula 1, and the soft segment comprises at least one (meth)acrylate-based repeat unit of the following Chemical Formula 2, and
    wherein the soft segments are regularly arranged in cylindrical forms on hard segments, and the cylindrical forms are regularly arranged in a square shape, by the solvent-annealing:

[Chemical Formula 1]
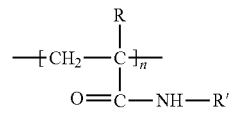

[Chemical Formula 2]
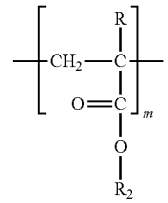

in the above Chemical Formula 1, n is an integer of from 5 to 600, R is hydrogen or a methyl group, R is X, X is —Z—R″, Z is a C6-20 arylene group, R″ is a C10-20 linear or branched hydrocarbon, and
in the above Chemical Formula 2, m is an integer of from 30 to 1000, $R_1$ is a methyl group, and $R_2$ is a methyl group.

2. The method for forming a nano pattern according to claim 1, wherein the removal of the soft segments comprises irradiating UV to the polymer thin film to decompose the soft segments, and removing the soft segments by acid treatment.

3. The method for forming a nano pattern according to claim 1, further comprising treating oxygen plasma to remove the polymer thin film, after the reactive ion etching.

\* \* \* \* \*

UNITED STATES PATENT AND TRADEMARK OFFICE
CERTIFICATE OF CORRECTION

PATENT NO. : 9,493,588 B2  
APPLICATION NO. : 13/992604  
DATED : November 15, 2016  
INVENTOR(S) : Yang-Kyoo Han et al.

Page 1 of 1

It is certified that error appears in the above-identified patent and that said Letters Patent is hereby corrected as shown below:

On the Title Page

The assignee data should read as below:

Assignee  
(73) LG CHEM, LTD., Seoul (KR); and  
IUCF-HYU (INDUSTRY-UNIVERSITY COOPERATION FOUNDATION HANYANG UNIVERSITY), Seoul (KR)

Signed and Sealed this  
Twenty-ninth Day of August, 2017

Joseph Matal  
*Performing the Functions and Duties of the*  
*Under Secretary of Commerce for Intellectual Property and*  
*Director of the United States Patent and Trademark Office*